United States Patent
Lee et al.

(10) Patent No.: US 9,601,496 B2
(45) Date of Patent: Mar. 21, 2017

(54) SEMICONDUCTOR DEVICE HAVING SACRIFICIAL LAYER PATTERN WITH CONCAVE SIDEWALLS AND METHOD FABRICATING THE SAME

(71) Applicant: Samsung Electronics Co., Ltd., Gyeonggi-do (KR)

(72) Inventors: Sanghoon Lee, Seongnam-si (KR); Hyunyong Go, Suwon-si (KR); Sunggil Kim, Yongin-si (KR); Kyong-Won An, Seoul (KR); Woosung Lee, Yongin-si (KR); Yongseok Cho, Yongin-si (KR)

(73) Assignee: SAMSUNG ELECTRONICS CO., LTD., Suwon-si, Gyeonngi-do (KR)

( * ) Notice: Subject to any disclaimer, the term of this patent is extended or adjusted under 35 U.S.C. 154(b) by 348 days.

(21) Appl. No.: 14/109,159

(22) Filed: Dec. 17, 2013

(65) Prior Publication Data
US 2014/0183749 A1     Jul. 3, 2014

(30) Foreign Application Priority Data
Jan. 2, 2013   (KR) .................. 10-2013-0000285

(51) Int. Cl.
| H01L 29/78 | (2006.01) |
| H01L 27/108 | (2006.01) |
| H01L 29/66 | (2006.01) |
| H01L 29/792 | (2006.01) |
| H01L 27/115 | (2017.01) |

(52) U.S. Cl.
CPC .... *H01L 27/10855* (2013.01); *H01L 27/1157* (2013.01); *H01L 27/11582* (2013.01); *H01L 29/66833* (2013.01); *H01L 29/7926* (2013.01); H01L 27/11578 (2013.01); H01L 2924/0002 (2013.01)

(58) Field of Classification Search
CPC ..................... H01L 29/7926; H01L 27/11578
USPC ....................................................... 257/324
See application file for complete search history.

(56) References Cited

U.S. PATENT DOCUMENTS

| 2010/0038699 A1 | 2/2010 | Katsumata et al. |
| 2010/0178755 A1 | 7/2010 | Lee et al. |
| 2011/0031547 A1 | 2/2011 | Watanabe |
| 2011/0287612 A1 | 11/2011 | Lee et al. |
| 2011/0306195 A1 | 12/2011 | Kim et al. |
| 2012/0037977 A1 | 2/2012 | Lee et al. |
| 2012/0049267 A1 | 3/2012 | Jung |
| 2012/0052673 A1 | 3/2012 | Yoo et al. |
| 2012/0098051 A1* | 4/2012 | Son ................... H01L 27/11582 257/324 |

(Continued)

FOREIGN PATENT DOCUMENTS

| JP | 2010-045314 | 2/2010 |
| JP | 2011-040533 | 2/2011 |

(Continued)

*Primary Examiner* — Marc Armand
*Assistant Examiner* — Tifney Skyles
(74) *Attorney, Agent, or Firm* — F. Chau & Associates, LLC

(57) ABSTRACT

In a method of fabricating a semiconductor device, sacrificial layer patterns are formed by leaving portions of sacrificial layers, instead of completely removing the sacrificial layers. Thus, the reliability of the semiconductor device may be increased, and the process of manufacturing the same may be simplified.

12 Claims, 14 Drawing Sheets

(56) References Cited

U.S. PATENT DOCUMENTS

2012/0100707 A1    4/2012   Ryu
2014/0070300 A1*   3/2014   Jang .................. H01L 27/11565
                                                                                           257/324

FOREIGN PATENT DOCUMENTS

KR    10-2010-0083629     7/2010
KR    10-2012-0041523     5/2012

* cited by examiner

SEMICONDUCTOR DEVICE HAVING SACRIFICIAL LAYER PATTERN WITH CONCAVE SIDEWALLS AND METHOD FABRICATING THE SAME

CROSS-REFERENCE TO RELATED APPLICATIONS

This U.S. non-provisional patent application claims priority under 35 U.S.C. §119 of Korean Patent Application No. 10-2013-0000285, filed on Jan. 2, 2013, the disclosure of which is incorporated by reference herein in its entirety.

TECHNICAL FIELD

Exemplary embodiments of the present disclosure relate to a semiconductor device, and more specifically, to a 3-dimensional semiconductor device and a method of fabricating the same.

DISCUSSION OF RELATED ART

In manufacturing a three-dimensional semiconductor device, slits or seams may be created in the conductive layers. These slits or seams may negatively affect the reliability of semiconductor device.

SUMMARY

An exemplary embodiment of the inventive concept provides a semiconductor device. The semiconductor device includes first and second conductive lines. The first and second conductive lines are spaced apart from each other. The first and second conductive lines are formed at substantially the same height from a substrate. A first sacrificial layer pattern is disposed between the first and second conductive lines. The first sacrificial layer pattern has at least one concave sidewall.

In an exemplary embodiment of the inventive concept, the first and second conductive lines each may have at least one sidewall which is curved toward the first sacrificial layer pattern.

In an exemplary embodiment of the inventive concept, the semiconductor device may further include a third conductive line disposed between the first conductive line and the substrate. A fourth conductive line is disposed between the second conductive line and the substrate. Gate interlayer dielectric layers are disposed between the first conductive line and the third conductive line and between the second conductive line and the fourth conductive line. An etch rate of the first sacrificial layer pattern may be different from an etch rate of the gate interlayer dielectric layers.

In an exemplary embodiment of the inventive concept, the semiconductor device may further include a second sacrificial layer pattern disposed between the third conductive line and the fourth conductive line. The second sacrificial layer pattern may have at least one concave sidewall.

In an exemplary embodiment of the inventive concept, the third conductive line and the fourth conductive line may contact each other.

In an exemplary embodiment of the inventive concept, the semiconductor device may further include a dummy active pattern disposed between the first conductive line and the second conductive line. The dummy active pattern contacts the first sacrificial layer pattern.

In an exemplary embodiment of the inventive concept, a semiconductor device includes a plurality of lower selection lines parallel to each other. The lower selection lines are disposed on a substrate. A plurality of word lines are disposed above the lower selection lines. The word lines are spaced apart from the lower selection lines. The word lines are parallel to each other. A plurality of upper selection lines are disposed above the word lines. The upper selection lines are spaced apart from the word lines. The upper selection lines are parallel to each other. A sacrificial layer pattern is disposed between the upper selection lines. The sacrificial layer pattern may have at least one concave sidewall.

In an exemplary embodiment of the inventive concept, the semiconductor device may further include a buried insulation pattern spaced apart from the sacrificial layer pattern. The buried insulation pattern is disposed between the upper selection lines. The buried insulation pattern may have flat side walls.

In an exemplary embodiment of the inventive concept, a method of fabricating a semiconductor device includes alternately stacking sacrificial layers and gate interlayer dielectric layers on a substrate. Portions of the sacrificial layers are removed, e.g., by performing an isotropic etching process, thus leaving sacrificial layer patterns between the gate interlayer dielectric layers. A conductive layer is formed on regions in which the sacrificial layers are removed.

In an exemplary embodiment of the inventive concept, a sacrificial layer positioned under an uppermost sacrificial layer of the sacrificial layers may have a lower density than a density of the uppermost sacrificial layer. A sacrificial layer positioned under the uppermost sacrificial layer of the sacrificial layers may have a higher etch rate than an etch rate of the uppermost sacrificial layer.

According to an exemplary embodiment of the inventive concept, in a method of fabricating a semiconductor device, a first sacrificial layer is formed on a substrate. A gate dielectric layer is formed on the first sacrificial layer. A second sacrificial layer is formed on the gate dielectric layer. An active pattern penetrates the first sacrificial layer, the gate dielectric layer, and the second sacrificial layer. A first sacrificial layer pattern is formed in a middle portion of the second sacrificial layer. The first sacrificial layer pattern is formed by etching the second sacrificial layer. A second sacrificial layer pattern is formed in a middle portion of the first sacrificial layer. The second sacrificial layer pattern is formed by etching the first sacrificial layer. The first and second sacrificial layers have different etch rates from each other. The first sacrificial layer pattern includes a portion of the second sacrificial layer remaining after etching the second sacrificial layer. The second sacrificial layer pattern includes a portion of the first sacrificial layer remaining after etching the first sacrificial layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
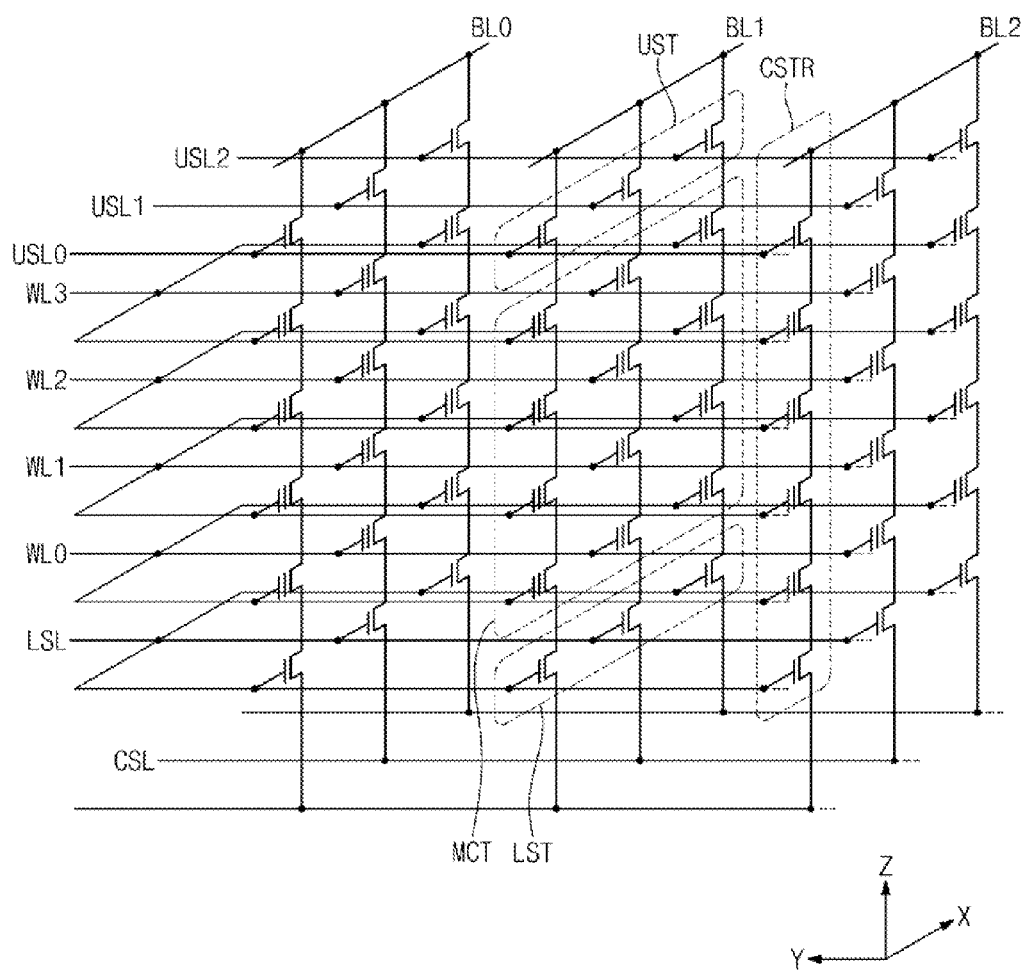
FIG. 1 is a circuit diagram illustrating a semiconductor device according to an exemplary embodiment of the inventive concept.

Exemplary embodiments of the inventive concept will be described with reference to the accompanying drawings. The inventive concept may, however, be embodied in different forms and should not be construed as limited to the embodiments set forth herein. Like reference numerals may refer to like or similar elements throughout the specification and the drawings.

When a layer (or film) is referred to as being "connected to," "coupled to," or 'on' another layer or substrate, it can be directly connected to, coupled to, or on the other layer or substrate, or intervening layers may also be present.

As used herein, the singular forms "a," "an," and "the" are intended to include the plural forms as well, unless the context clearly indicates otherwise.

Figure 2:
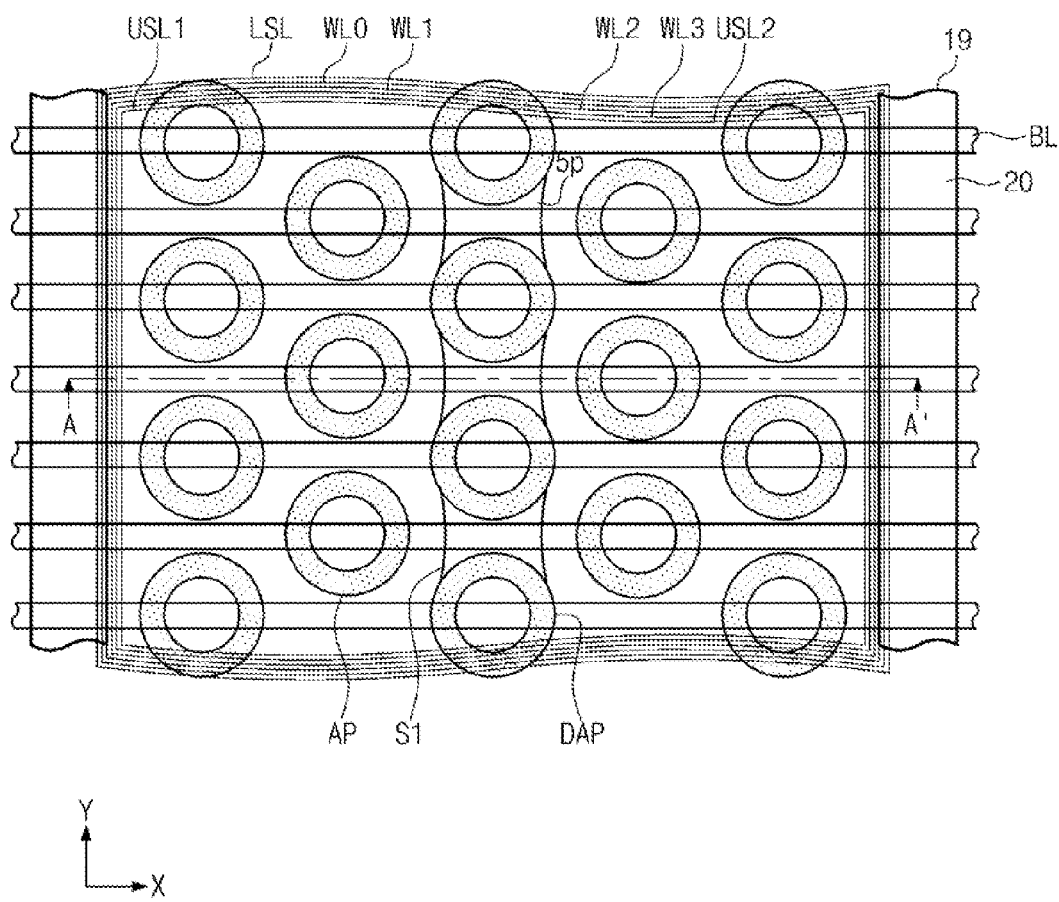
FIG. 2 is a plan view illustrating a semiconductor device according to an exemplary embodiment of the inventive concept.
Figure 3:
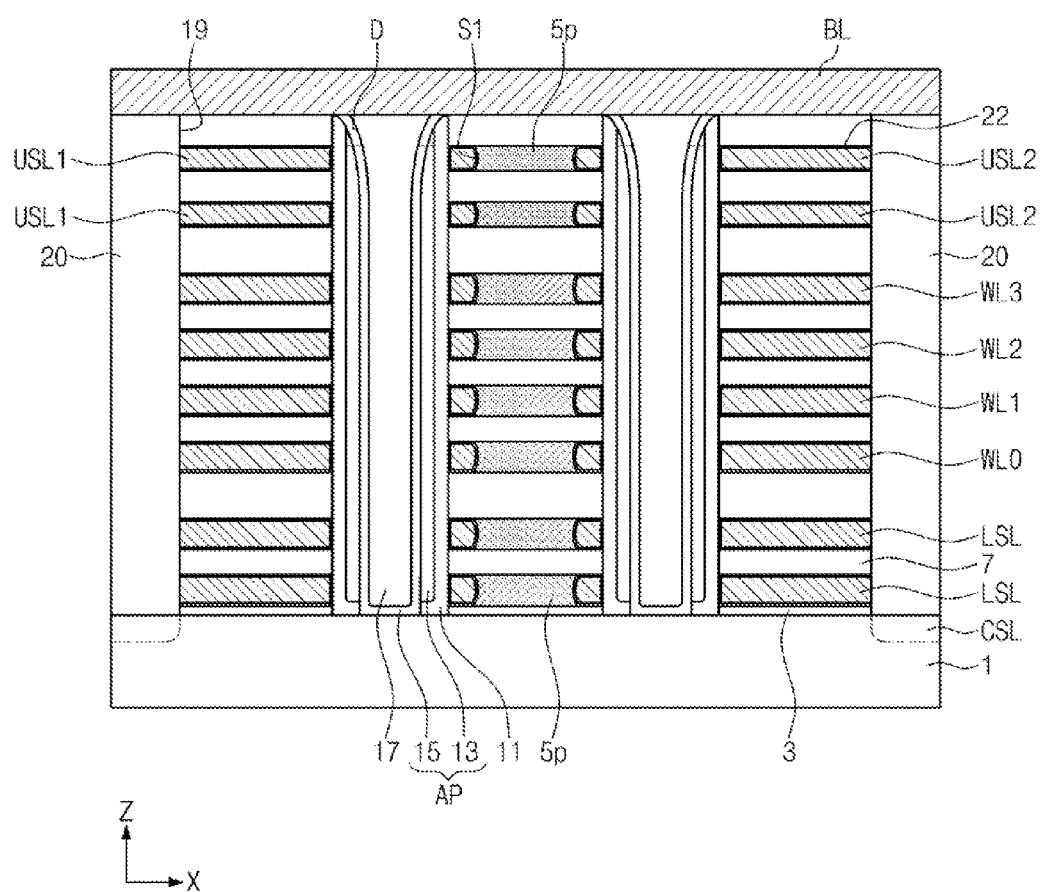
FIG. 3 is a cross-sectional view taken along line A-A' of FIG. 2 according to an exemplary embodiment of the inventive concept.

FIG. 1 is a circuit diagram illustrating a semiconductor device according to an exemplary embodiment of the inventive concept. FIG. 2 is a plan view illustrating a semiconductor device according to an exemplary embodiment of the inventive concept. FIG. 3 is a cross-sectional view taken along line A-A' of FIG. 2 according to an exemplary embodiment of the inventive concept.

Referring to FIGS. 1 to 3, a vertical-type semiconductor memory device according to an exemplary embodiment of the inventive concept may include a common source line CSL, a plurality of bit lines BL0, BL1 and BL2, and a plurality of cell strings CSTR disposed between the common source line CSL and the bit lines BL0 to BL2.

The common source line CSL may correspond to an impurity-doped region of a substrate 1. The semiconductor substrate 1 may be a semiconductor substrate itself, or the semiconductor substrate 1 may be an epitaxial semiconductor layer formed on a semiconductor substrate. The bit lines BL0 to BL2 may be conductive lines which are spaced apart from the semiconductor substrate 1. The bit lines BL0 to BL2 are disposed above the semiconductor substrate 1. The bit lines BL0 to BL2 are two-dimensionally arranged, and the plurality of cell strings CSTR is connected in parallel to each bit line. Thus, the cell strings CSTR are two-dimensionally arranged on the semiconductor substrate 1.

Each cell string CSTR may include a lower selection transistor LST contacting the common source line CSL, an upper selection transistor UST contacting the bit lines BL0 to BL2, and a plurality of memory cell transistors MCT disposed between the lower and upper selection transistors LST and UST. The lower selection transistor LST, the upper selection transistor UST, and the memory cell transistors MCT may be connected in series to each other. A lower section line LSL, a plurality of word lines WL0 to WL3, and a plurality of upper selection lines USL0 to USL2, which are disposed between the common source line CSL and the bit lines BL0 to BL2, may be used as the respective gate electrodes of the lower selection transistor LST, the memory cell transistors MCT, and the upper selection transistors UST. The common source lines CSL, the lower section line LSL, the word lines WL, and the upper selection lines USL may extend in a first direction X. The bit lines BL may extend in a second direction Y crossing the first direction X.

The lower selection transistors LST may be disposed at substantially the same distance from the semiconductor substrate 1. The gate electrodes of the lower selection transistors LST may be commonly connected to the lower selection line LSL, and thus, the gate electrodes of the lower selection transistors LST may be left in an equipotential state. Similarly, the gate electrodes of the plurality of memory cell transistors MCT disposed at substantially the same distance from the common source line CSL may also be left in an equipotential state since the gate electrodes of the plurality of memory cell transistors MCT are commonly connected to one of the word lines WL0 to WL3. Since a single cell string CSTR includes the plurality of memory cell transistors MCT having different distances from the common source line CSL, the multilayer word lines WL0 to WL3 are disposed between the common source line CSL and the bit lines BL0 to BL2.

Each cell string CSTR may include an active pattern AP that vertically extends from the semiconductor substrate 1 and that contacts the bit lines BL0 to BL2. The active pattern AP may penetrate the upper selection lines USL0 to USL2, the lower selection line LSL, and the word lines WL0 to WL3.

A gate dielectric layer 11 may be disposed between the lines USL, LSL and WL and the active pattern AP. According to an exemplary embodiment of the inventive concept, the gate dielectric layer 11 may include a tunnel dielectric layer, a charge trap layer, and/or a blocking dielectric layer. The charge trap layer might not be disposed between the lower selection line LSL and the active pattern AP or between the upper selection lines USL0 to USL2 and the active pattern AP. A high-k dielectric layer 22 may be disposed between the gate dielectric layer 11 and the lines USL, LSL and WL. A common drain region D is disposed at an upper end of the active pattern AP. The high-k dielectric layer 22 may include a blocking layer.

The lower and upper selection transistors LST and UST and the memory cell transistors MCT may be metal-oxide-semiconductor field-effect transistors (MOSFETs) that may use the active pattern AP as a channel region. The active pattern AP includes a first active layer 13 and a second active layer 15. The active layers 13 and 15 may include a polysilicon layer or a semiconductor layer which is not doped with an impurity. The first active layer 13 may be shaped as, e.g., a spacer. The second active layer 15 contacts the first active layer 13 and the substrate 1. The active pattern AP may be shaped as a cup. The inside of the active pattern AP is filled with a first buried insulation pattern 17.

In an exemplary embodiment of the inventive concept, the upper selection lines USL may be disposed on two layers, respectively, and the lower selection lines LSL may be disposed on two layers, respectively.

A buffer oxide layer 3 may be disposed on the substrate 1. Gate interlayer dielectric layers 7 are disposed on a top surface of the upper selection line USL, between the upper selection line USL and the word line W3, between the word lines WL0 to WL3, and between the word line WL0 and the lower selection line LSL. A second buried insulation pattern 20 is disposed between the upper selection lines USL0 to USL2, and thus, the upper selection lines USL0 to USL2 may be separated from each other. The second buried insulation pattern 20 may be disposed between the word lines WL0 to WL3 and between the lower selection lines LSL.

Sacrificial layer patterns 5p spaced apart from the buried insulation pattern 20 are disposed between at least the upper selection lines USL among the lines USL, LSL and WL. The sacrificial layer pattern 5p may include a layer having an etch rate different from an etch rate of the gate interlayer dielectric layer 7. For example, the gate interlayer dielectric layer 7 may include a silicon oxide layer, and the sacrificial layer pattern 5p may include a silicon nitride layer. The sacrificial layer pattern 5p has concave side walls S1. Thus, the upper selection lines USL may have sidewalls that are curved toward the sacrificial layer pattern 5p. A dummy active pattern DAP contacting the sacrificial layer pattern 5p may be disposed between the upper selection lines USL. The dummy active pattern DAP has substantially the same form as the active pattern AP, but the dummy active pattern DAP does not function as a substantial active layer. The dummy active pattern DAP may relieve stress of adjacent structures.

In an exemplary embodiment of the inventive concept, the sacrificial layer patterns 5p may be disposed between the upper selection lines USL, between the word lines WL, and between the lower selection lines LSL, which have the same height.

FIGS. 4 to 8 are cross-sectional views sequentially illustrating a process of fabricating a semiconductor device having a cross section of FIG. 3, according to an exemplary embodiment of the inventive concept.

Figure 4:
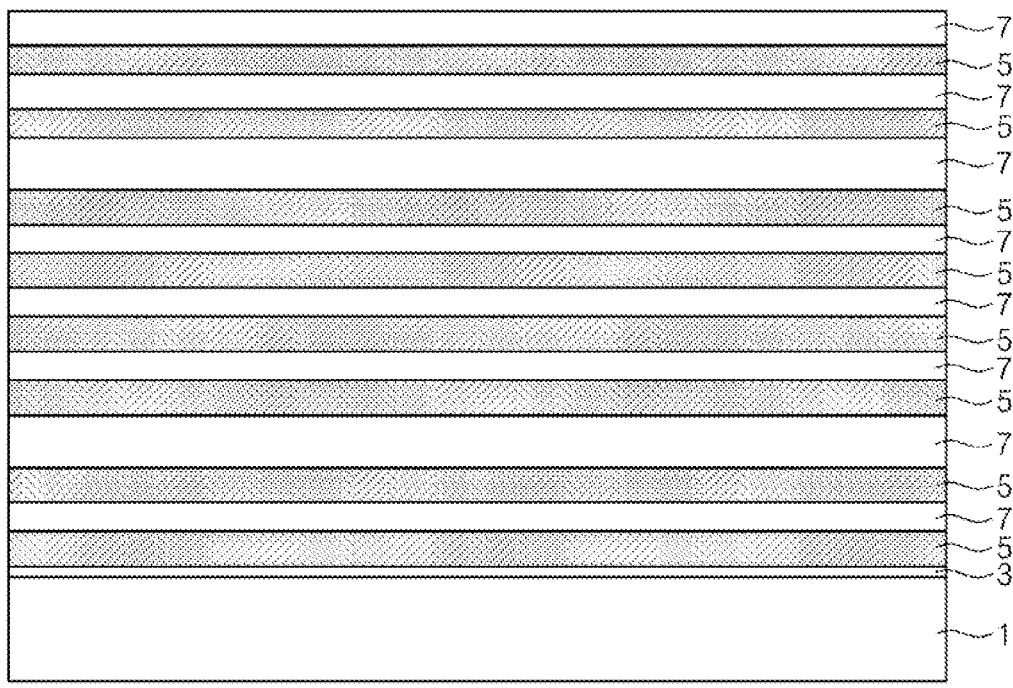
FIGS. 4 to 8 are cross-sectional views sequentially illustrating a process of fabricating a semiconductor device having a cross section of FIG. 3, according to an exemplary embodiment of the inventive concept.

Referring to FIG. 4, a buffer oxide layer 3 is formed on a substrate 1. Sacrificial layers 5 and gate interlayer dielectric layers 7 are alternately stacked on the buffer oxide layer 3. The sacrificial layers 5 are formed of a material having an etch rate different from an etch rate of the gate interlayer dielectric layers 7. For example, the sacrificial layer 5 may be a silicon nitride layer, and the gate interlayer dielectric layer 7 may be a silicon oxide layer. In an exemplary embodiment of the inventive concept, the sacrificial layers 5 may include silicon nitride layers having substantially the same density regardless of height.

Figure 5:
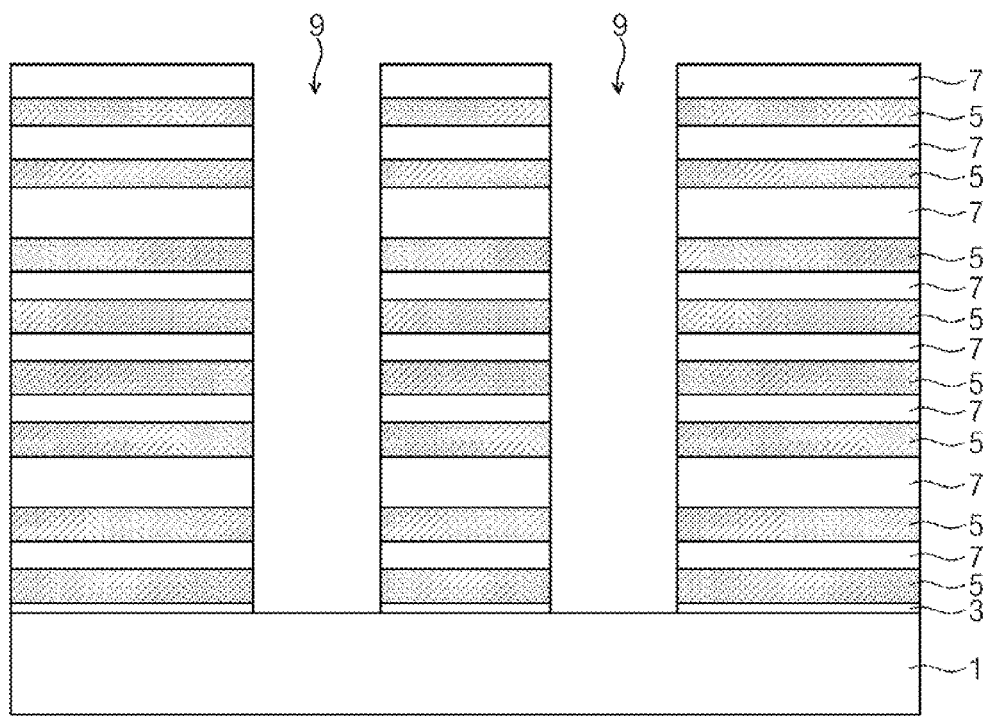

Referring to FIG. 5, active holes 9 for exposing the substrate 1 are formed by sequentially patterning the gate interlayer dielectric layers 7, the sacrificial layers 5, and the buffer oxide layer 3.

Figure 6:
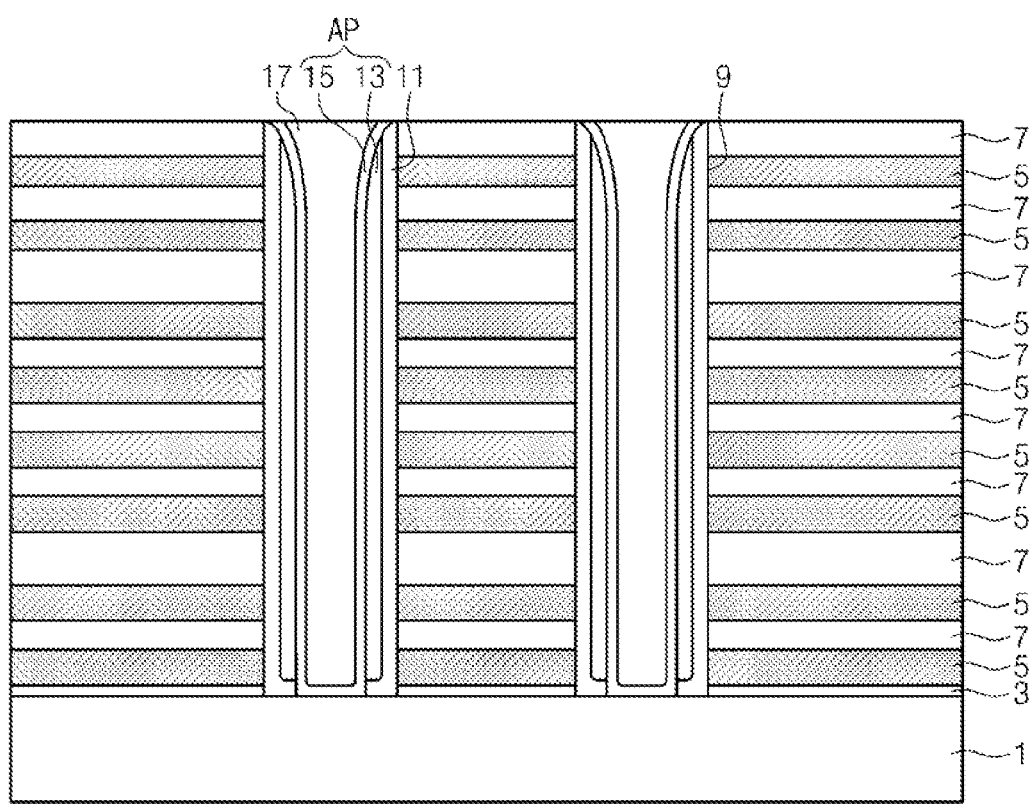

Referring to FIG. 6, a gate dielectric layer 11 and a first active layer 13 are conformally formed on an entire surface of the substrate 1 having the active holes 9 formed thereon. Then, the gate dielectric layer 11 and the first active layer 13 shaped as, e.g., a spacer, are formed by anisotropic etching, and the substrate 1 is exposed through the active holes 9. A second active layer 15 is conformally formed, and the active holes 9 are filled with a first buried insulation layer 17. A planarization etching process is performed, forming the gate dielectric layer 11, an active pattern AP, and the first buried insulation pattern 17 in the active hole 9.

Figure 7:
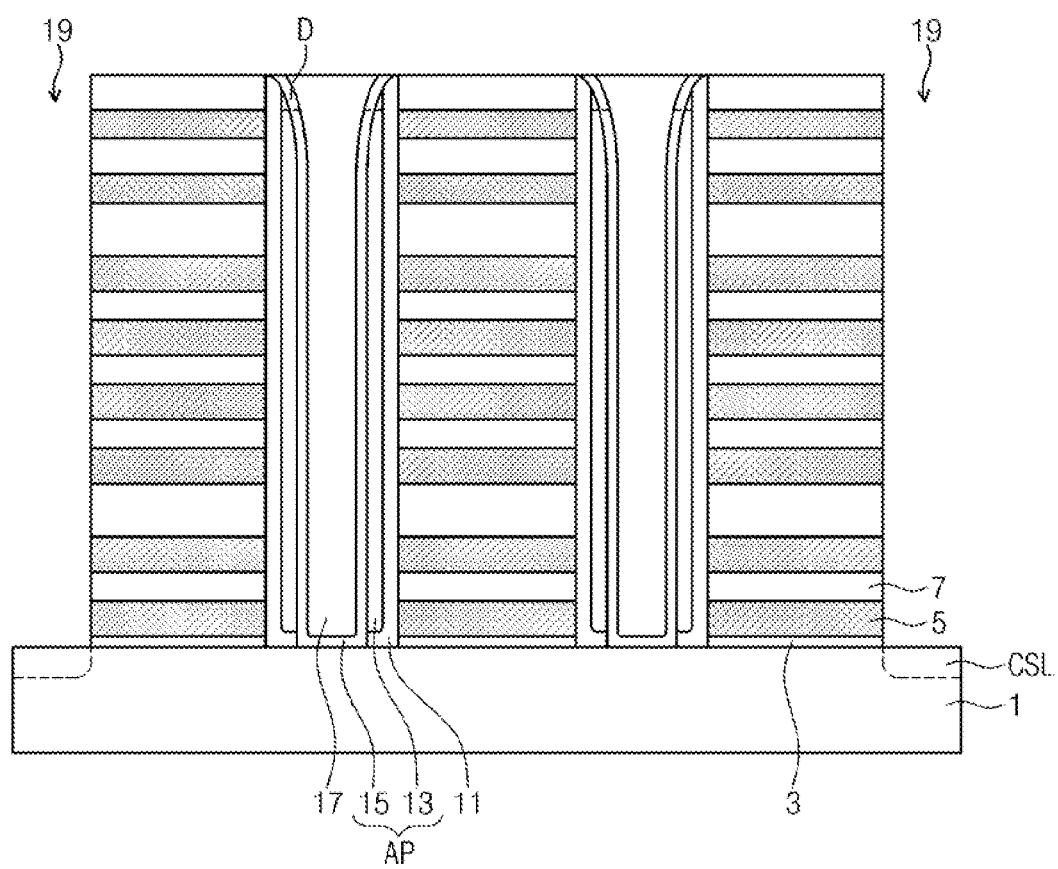

Referring to FIG. 7, the gate interlayer dielectric layers 7, the sacrificial layers 5, and the buffer oxide layers 3 are sequentially patterned at positions spaced apart from the active holes 9, thus forming grooves 19 that expose the substrate 1. An ion implantation process is performed, forming a common source line CSL in the substrate 1 under the grooves 19 and forming drain regions D in upper portions of the active patterns AP.

Figure 8:
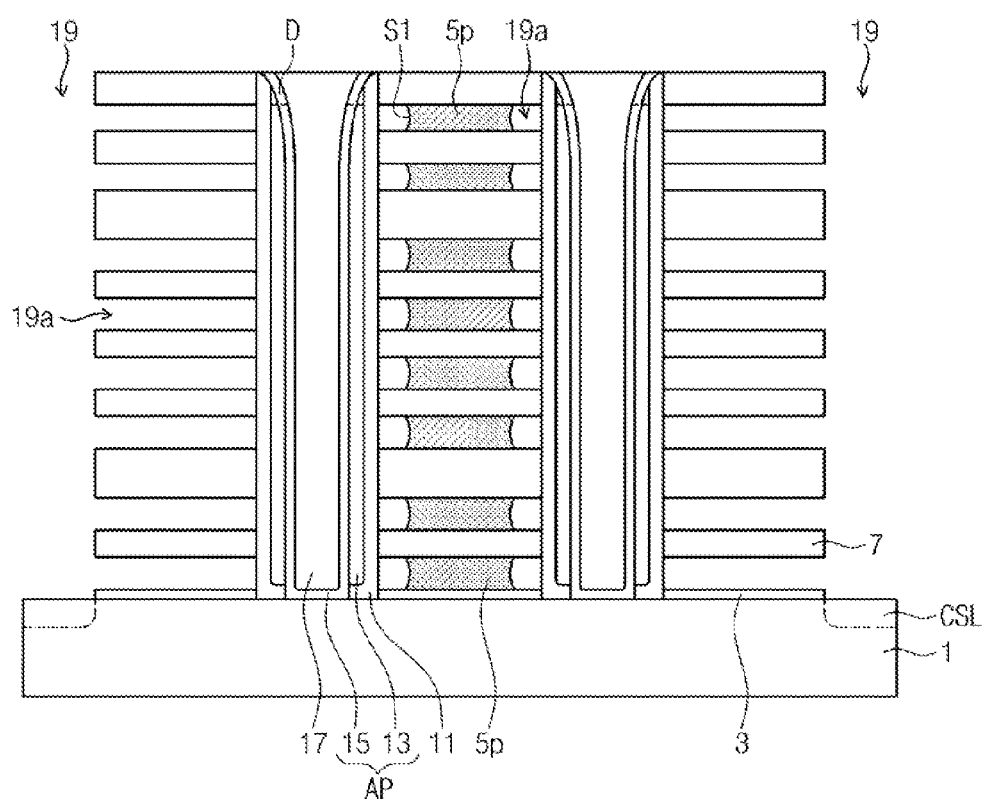

Referring to FIGS. 2 and 8, portions of the sacrificial layers 5 are removed through the grooves 19 by performing an isotropic etching process. During the isotropic etching process, an etchant may penetrate through sidewall portions of the sacrificial layers 5, which are exposed by the grooves 19, into the inside of the sacrificial layers 5. A time during which the etching process is performed is adjusted, stopping the etching process before the sacrificial layers 5 are entirely etched. Thus, the sacrificial layers 5 are not removed, and sacrificial layer patterns 5p remain at positions that are away from the grooves 19. The sacrificial layer patterns 5p may be formed substantially midway between the grooves 19 adjacent to each other. Sidewalls of the sacrificial layer patterns 5p may be rendered concave by the isotropic etching process because the etchant may be more prone to flow towards the middle portion of the sacrificial layer pattern 5 as compared with the edge portions of the sacrificial layer pattern 5 and thus the middle portion of the sacrificial layer pattern 5 is more etched than the edge portions of the sacrificial layer pattern 5. Accordingly, the etching process leaves a space 19a at two opposite sides of the sacrificial layer pattern in each sacrificial layer 5.

Referring again to FIGS. 2 and 3, a high-k dielectric layer 22 is conformally formed on the substrate 1. A conductive layer is formed by using a deposition process, filling the grooves 19 and the spaces 19a. Accordingly, slits or seams may be formed in the conductive layer. The conductive layer may be, e.g., a tungsten layer. Tungsten fluoride ($WF_6$) gas may be used to form the tungsten layer. A trace amount of the tungsten fluoride gas may be present in the slits. Thus, the tungsten fluoride gas may react with hydrogen (H) that may be present in other structures, and thus, hydrofluoric acid (HF) may be generated. Since the HF may damage the gate dielectric layer 11, the reliability or characteristics of a semiconductor device to be formed may be degraded. However, in an exemplary embodiment of the inventive concept, an area, in which the slits are formed, may be significantly reduced by the sacrificial layer patterns 5p, and thus, the possibility of damage to the gate dielectric layer 11 may be significantly reduced. Thus, the reliability or characteristic quality of the semiconductor device may be increased.

The conductive layer in the grooves 19 is removed, and a second buried insulation pattern 20 is formed in the grooves 19. Thus, lower selection lines LSL, word lines WL, and upper selection lines USL may be formed. Subsequently, bit lines BL are formed that contact the drain regions D.

In an exemplary embodiment of the inventive concept, since the upper selection lines USL are separated by the sacrificial layer patterns 5p, separate insulation patterns for separating the upper selection lines USL are not needed, thus processing may be simplified.

Figure 9:
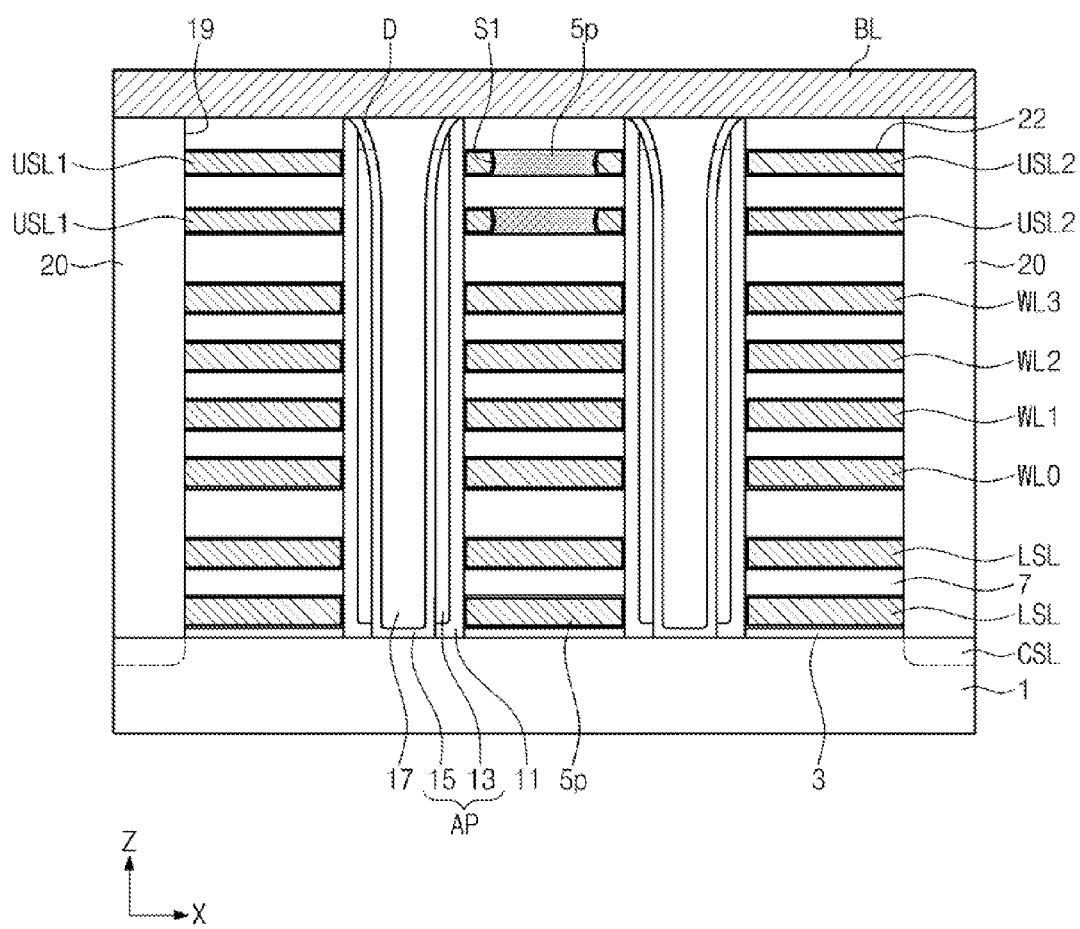
FIG. 9 is a cross-sectional view taken along line A-A' of FIG. 2 according to an exemplary embodiment of the inventive concept.

FIG. 9 is a cross-sectional view taken along line A-A' of FIG. 2 according to an exemplary embodiment of the inventive concept.

Referring to FIG. 9, in a semiconductor device according to an exemplary embodiment of the inventive concept, sacrificial layer patterns 5p are disposed only between upper selection lines USL. No sacrificial layer patterns 5p are disposed between word lines WL and between lower selection lines LSL.

Figure 10:
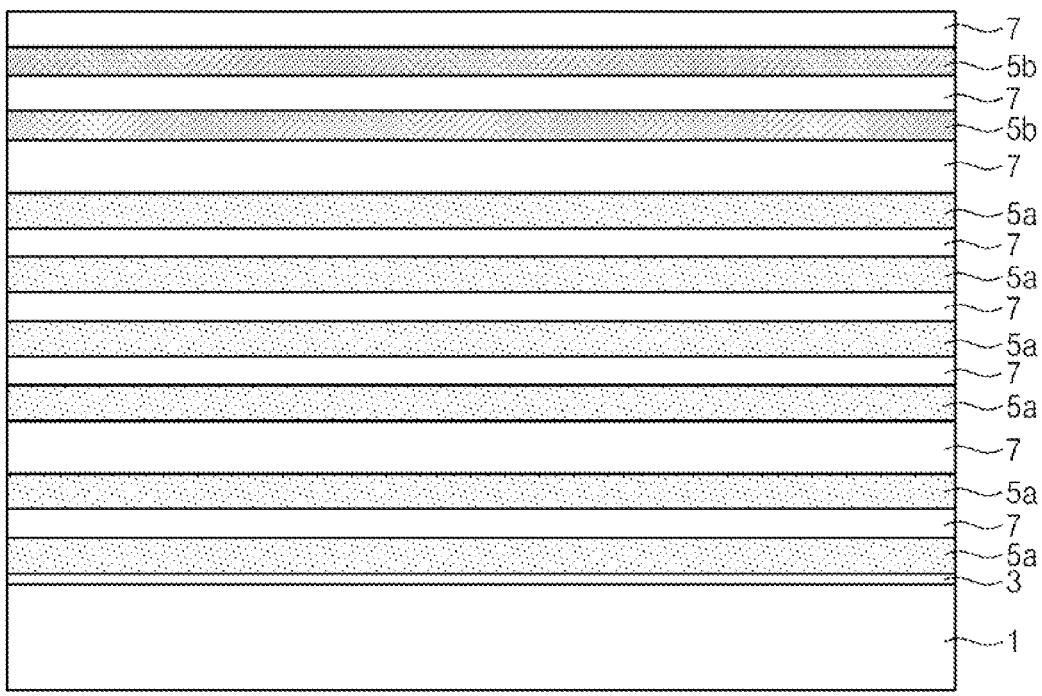
FIGS. 10 and 11 are cross-sectional views sequentially illustrating a process of fabricating a semiconductor device having a cross section of FIG. 9, according to an exemplary embodiment of the inventive concept.
Figure 11:
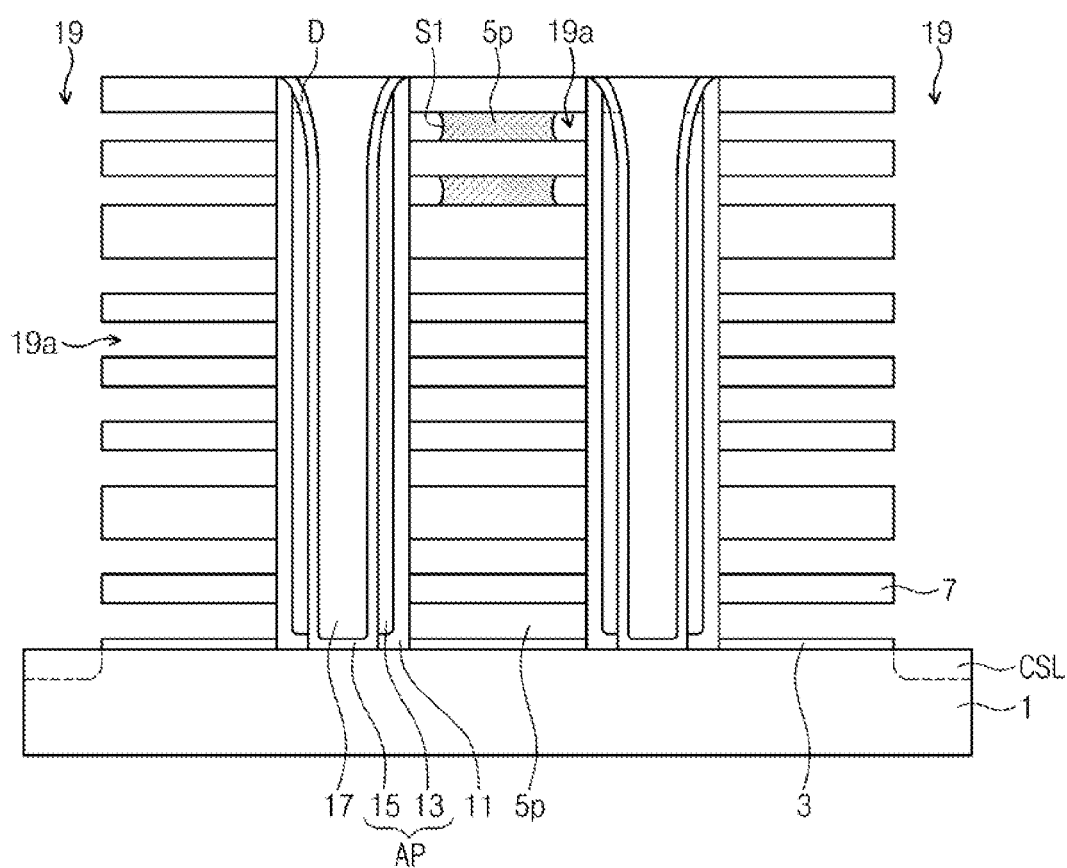

FIGS. 10 and 11 are cross-sectional views sequentially illustrating a process of fabricating a semiconductor device having a cross section of FIG. 9, according to an exemplary embodiment of the inventive concept.

Referring to FIG. 10, a buffer oxide layer 3, first sacrificial layers 5a, and gate interlayer dielectric layers 7 are alternately stacked on a substrate 1. Second sacrificial layers 5b and gate interlayer dielectric layers 7 are alternately stacked on the gate interlayer dielectric layer 7. All of the first and second sacrificial layers 5a and 5b may include a silicon nitride layer. However, the second sacrificial layers 5b may be harder than the first sacrificial layers 5a. For example, the first sacrificial layers 5a may have a lower density than a density of the second sacrificial layers 5b. The first sacrificial layers 5a may have a higher etch rate than an etch rate of the second sacrificial layers 5b.

In the state of FIG. 10, a gate dielectric layer 11, active patterns AP, and a first buried insulation pattern 17 are formed as described in FIGS. 5 and 6. Grooves 19 are formed by patterning the gate interlayer dielectric layers 7, the first and second sacrificial layers 5a and 5b and the buffer oxide layer 3, and a common source line CSL and drain regions D are formed by performing an ion implantation process.

Referring to FIG. 11, portions of the first and second sacrificial layers 5a and 5b are removed through the grooves 19 by performing an isotropic etching process. Since the etch rate of the first sacrificial layers 5a is higher than the etch rate of the second sacrificial layers 5b, portions of the second sacrificial layers 5b may remain even when the first sacrificial layers 5a are entirely removed. Thus, the sacrificial layer patterns 5p may be formed.

Substantially the same subsequent process as described above in connection with FIGS. 1 to 8 may be performed here, thus forming a similar semiconductor device.

Figure 12:
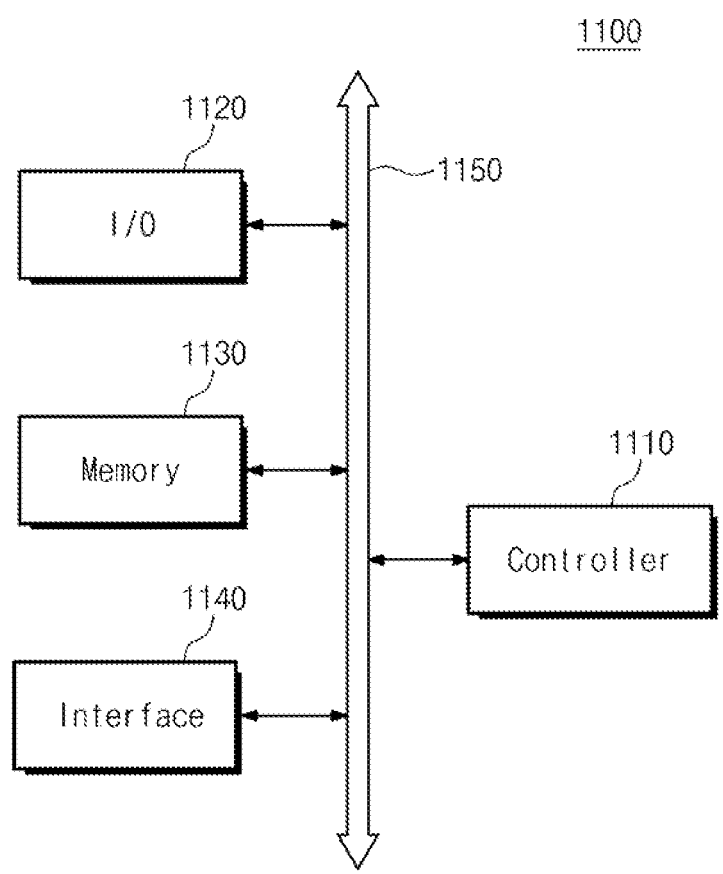
FIG. 12 is a block diagram illustrating a memory system including a three-dimensional semiconductor device according to an exemplary embodiment of the inventive concept.

FIG. 12 is a block diagram illustrating a memory system including a three-dimensional semiconductor device according to an exemplary embodiment of the inventive concept.

Referring to FIG. 12, the memory system 1100 may be applied to a personal digital assistant (PDA), a portable computer, a tablet computer, a wireless phone, a mobile phone, a smart phone, a digital music player, a memory card, and any device which may transmit and/or receive data in a wireless environment.

The memory system 1100 includes an input/output device 1120, such as a controller 1110, a keypad, a keyboard and a display, a memory 1130, an interface 1140, and a bus 1150. The memory 1130 and the interface 1140 communicate with each other through the bus 1150.

The controller 1110 includes at least one micro processor, a digital signal processor, a micro controller, and any other similar processing device. The memory 1130 may be used to store a command to be performed by the controller 1110. The input/output device 1120 may input data or a signal from an external device of the system 110, or the input/output device 1120 may output data or a signal to the external device of the system. For example, the input/output device 1120 may include a keyboard, a key pad, and a display device.

The memory 1130 includes a non-volatile memory device according to an exemplary embodiment of the inventive concept. The memory 1130 may also include a different type of memory such as a randomly accessible volatile memory, and various other types of memories.

The interface 1140 dispatches data to a communication network, and/or the interface 1140 receives data from the network.

Figure 13:
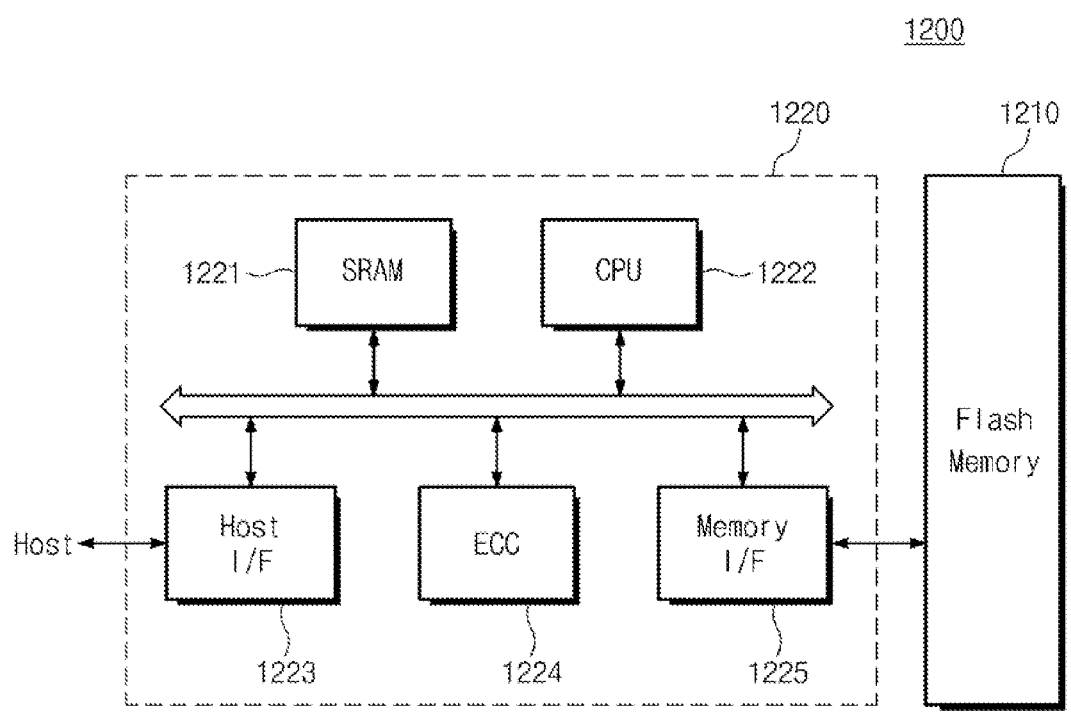
FIG. 13 is a block diagram illustrating a memory card having the three-dimensional semiconductor device according to an exemplary embodiment of the inventive concept.

FIG. 13 is a block diagram illustrating a memory card having a three-dimensional semiconductor device according to an exemplary embodiment of the inventive concept.

Referring to FIG. 13, the memory card 1200, which may support a high volume of data storage capacity, includes a flash memory device 1210 according to an exemplary embodiment of the inventive concept. The memory card 1200 according to an exemplary embodiment of the inventive concept includes a memory controller 1220 which controls exchange of various types of data between a host and the flash memory 1210.

A static random access memory (SRAM) 1221 may be used as a working memory of a processing unit 1222. A host interface 1223 may have a data exchange protocol for the host contacting the memory card 1200. An error correction code 1224 may detect and correct an error which is included in the data read out from the multi-bit flash memory device 1210. A memory interface 1225 interfaces with the flash memory device 1210 according to an exemplary embodiment of the inventive concept. The processing unit 1222 performs various control operations for data exchange of the memory controller 1220. The memory card 1200 according to an exemplary embodiment of the inventive concept may further include a read only memory (ROM) which stores code data for interfacing with the host.

According to an exemplary embodiment of the inventive concept, the reliability of a memory system may be increased by the flash memory device 1210. The flash memory device according to an exemplary embodiment of the inventive concept may be provided in a memory system, such as solid state disk ("SSD"). Errors that would otherwise be caused by the dummy cells may be prevented, enabling a memory system to have high reliability.

Figure 14:
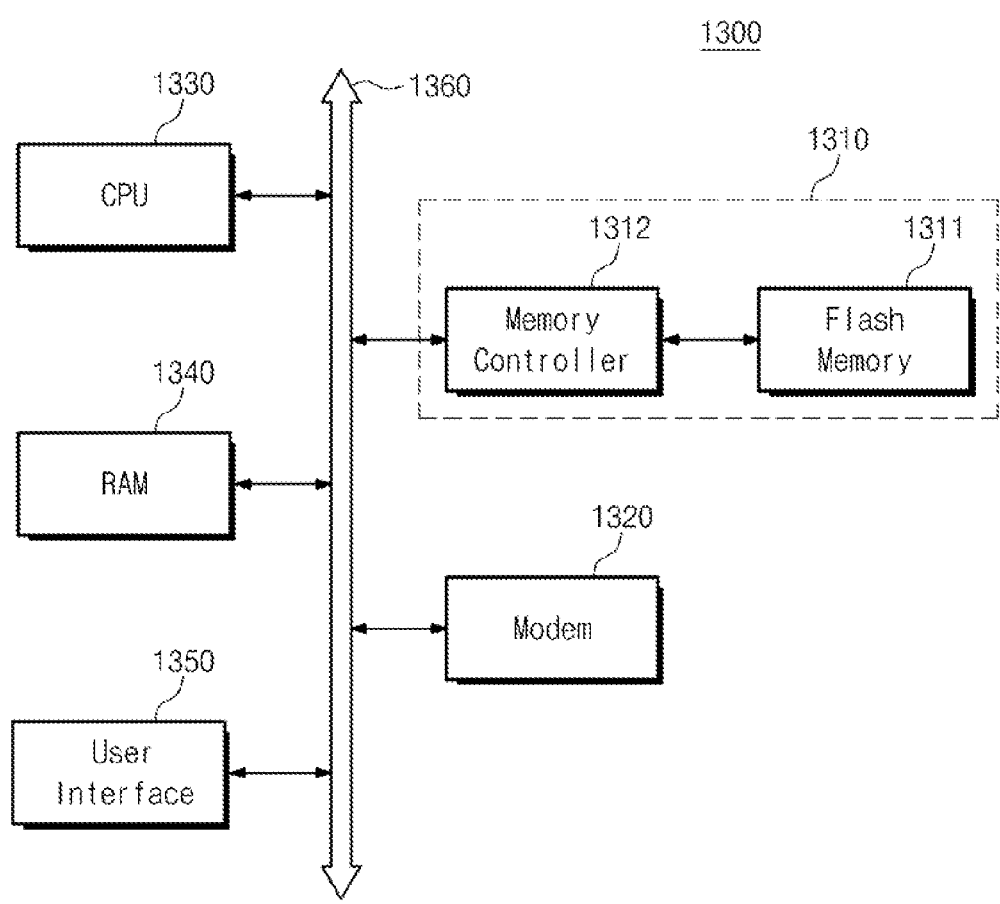
FIG. 14 is a block diagram illustrating a data processing system including a three-dimensional semiconductor device according to an exemplary embodiment of the inventive concept.

FIG. 14 is a block diagram illustrating a data processing system including a three-dimensional semiconductor device according to an exemplary embodiment of the inventive concept.

Referring to FIG. 14, a flash memory system 1310 according to an exemplary embodiment of the inventive concept is mounted in a data processing system, such as a mobile device or a desktop computer. The data processing system 1300 according to an exemplary embodiment of the inventive concept includes the flash memory system 1310, a modem 1320, a central processing unit 1330, a random access memory (RAM) 1340, and a user interface 1350 which are electrically connected to a system bus 1360. The flash memory system 1310 may be substantially the same as the memory system or the flash memory system described above in connection with FIG. 12. The flash memory system 1310 stores the data processed by the central processing unit 1330 or the data inputted from an outside device. The flash memory system 1310 may include a solid state disk (SSD), and in this case, the data processing system 1300 may stably store a high volume of data in the flash memory system 1310. Due to the increase in reliability, the flash memory system 1310 may reduce the resources required for error correction, thus enabling high-speed data exchange for the data processing system 1300. The data processing system 1300 according to an exemplary embodiment of the inventive concept may further include an application chipset, a camera image processor (CIS), and an input/out device or the like.

The flash memory device or the memory system according to an exemplary embodiment of the inventive concept may be mounted in various types of packages. For example, the flash memory device or the memory system according to an exemplary embodiment of the inventive concept may be mounted in a package, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), wafer-level processed stack package (WSP) and the like.

In a method of fabricating a semiconductor device according to an exemplary embodiment of the inventive concept, sacrificial layer patterns are formed by leaving portions of sacrificial layers when removing the sacrificial layers, thus reducing an area in which slits are formed during the formation of a conductive layer. Therefore, damage to gate dielectric layers that may occur due to a fluorine compound that may remain in the slits may be prevented. Accordingly, the reliability of a semiconductor device may be increased. Furthermore, since the sacrificial layer patterns are formed between, at least, upper selection lines, separate insulation patterns for separating the upper selection lines are not needed, thus leading to simplified processing.

While the inventive concept has been particularly shown and described with reference to exemplary embodiments thereof, it will be understood by those of ordinary skill in the art that various changes in form and details may be made therein without departing from the spirit and scope of the inventive concept.

What is claimed is:

1. A semiconductor device, comprising:
   a first conductive line;
   a second conductive line formed at substantially the same height from a substrate as the first conductive line, wherein the first and second conductive lines are spaced apart from each other; and
   a first sacrificial layer pattern disposed between the first and second conductive lines and formed at substantially the same height from the substrate as the first and second conductive lines,
   wherein the first sacrificial layer pattern has at least one concave sidewall.

2. The semiconductor device of claim 1, wherein the first and second conductive lines each have at least one sidewall which is curved toward the first sacrificial layer pattern.

3. The semiconductor device of claim 1, further comprising:
   a third conductive line disposed between the first conductive line and the substrate;
   a fourth conductive line disposed between the second conductive line and the substrate; and
   gate interlayer dielectric layers disposed between the first conductive line and the third conductive line and between the second conductive line and the fourth conductive line,
   wherein an etch rate of the first sacrificial layer pattern is different from an etch rate of the gate interlayer dielectric layers.

4. A semiconductor device, comprising:
   a first conductive line;
   a second conductive line formed at substantially the same height from a substrate as the first conductive line, wherein the first and second conductive lines are spaced apart from each other; and
   a first sacrificial layer pattern disposed between the first and second conductive lines,
   a third conductive line disposed between the first conductive line and the substrate;
   a fourth conductive line disposed between the second conductive line and the substrate; and
   gate interlayer dielectric layers disposed between the first conductive line and the third conductive line and between the second conductive line and the fourth conductive line,
   a second sacrificial layer pattern disposed between the third conductive line and the fourth conductive line,
   wherein the first sacrificial layer pattern has at least one concave sidewall,
   wherein an etch rate of the first sacrificial layer pattern is different from an etch rate of the gate interlayer dielectric layers, and
   wherein the second sacrificial layer pattern has at least one concave sidewall.

5. The semiconductor device of claim 3, wherein the third conductive line and the fourth conductive line contact each other.

6. The semiconductor device of claim 1,
   further comprising a dummy active pattern disposed between the first conductive line and the second conductive line,
   wherein the dummy active pattern contacts the first sacrificial layer pattern.

7. The semiconductor device of claim 1,
   further comprising a plurality of gate interlayer dielectric layers,
   wherein the first and second conductive lines and the first sacrificial layer pattern is interposed between an adjacent pair of the gate interlayer dielectric layers.

8. A semiconductor device comprising:
   a plurality of lower selection lines that are parallel to each other on a substrate;
   a plurality of word lines disposed above the lower selection lines, the word lines spaced apart from the lower selection lines, wherein the word lines are parallel to each other;
   a plurality of upper selection lines disposed above the word lines, the upper selection lines spaced apart from the word lines, wherein the upper selection lines are parallel to each other; and
   a sacrificial layer pattern disposed between the upper selection lines and formed at substantially the same height from the substrate as the upper selection lines,
   wherein the sacrificial layer pattern has at least one concave sidewall.

9. The semiconductor device of claim 8,
   further comprising a buried insulation pattern spaced apart from the sacrificial layer pattern, the buried insulation pattern disposed between the upper selection lines,
   wherein the buried insulation pattern has flat side walls.

10. The semiconductor device of claim 9, wherein the buried insulation pattern is disposed between the word lines and between the lower selection lines.

11. The semiconductor device of claim 9, wherein the buried insulation pattern is formed of a material different from the sacrificial layer pattern.

12. The semiconductor device of claim 8,
    further comprising a plurality of gate interlayer dielectric layers disposed on a top surface of the plurality of upper selection lines, between the upper selection line and the word line, wherein the first sacrificial layer pattern is interposed between an adjacent pair of the gate interlayer dielectric layers.

* * * * *